United States Patent [19]

Fiering et al.

[11] Patent Number: 5,391,269
[45] Date of Patent: Feb. 21, 1995

[54] METHOD OF MAKING AN ARTICLE COMPRISING A SILICON BODY

[75] Inventors: Jason O. Fiering, Providence, R.I.; Barry Miller; Joseph Shmulovich, both of Murray Hill, N.J.

[73] Assignee: AT&T Corp., Murray Hill, N.J.

[21] Appl. No.: 84,689

[22] Filed: Jun. 29, 1993

[51] Int. Cl.[6] .............................................. B23H 3/00
[52] U.S. Cl. ........................ 204/129.75; 204/129.1; 205/124; 437/228
[58] Field of Search ............... 204/129.1, 129.75; 205/124; 437/228

[56] References Cited

U.S. PATENT DOCUMENTS 4,765,865 8/1988 Gealer et al. ........................ 156/647
5,179,609 1/1993 Blonder et al. ........................ 385/89

OTHER PUBLICATIONS

"Water-Amine-Complexing Agent System", by R. M. Finne et al., Journal of the Electrochemical Society, vol. 114(9), pp. 956-970, Sep. 1967.

"Wet Silicon Etching with Aqueous Amine Gallates", by H. Linde et al., Journal of the Electrochemical Society, vol. 139(4), pp. 1170-1174, Apr. 1992.

Primary Examiner—John Niebling
Assistant Examiner—Edna Wong
Attorney, Agent, or Firm—Eugen E. Pacher

[57] ABSTRACT

We have found that etching of a body that comprises exposed Si as well as a Ti-comprising metal layer (e.g., a patterned Ti/Pt layer) in an amine-based anisotropic etchant for Si (e.g., 100° C. EDP) frequently results in undesirable changes in the Ti-comprising metal layer. We have also found that the changes can be substantially reduced or eliminated by electrolytic means, namely, by making the metal layer the anode in an electrolytic cell that contains the etchant.

9 Claims, 1 Drawing Sheet

METHOD OF MAKING AN ARTICLE COMPRISING A SILICON BODY

FIELD OF THE INVENTION

The invention pertains to making a silicon body with a metal layer thereon by a process that involves anisotropic etching of the silicon body. The metal layer may be present in the completed article or may only be present at an intermediate stage of the manufacture.

BACKGROUND OF THE INVENTION

Anisotropically etched silicon bodies (typically Si wafers) with a patterned metal layer thereon are advantageously used for a variety of purposes. For instance, such a combination finds use in a technology that is frequently referred to as "silicon optical bench" (SOB). See, for instance, U.S. Pat. No. 5,179,609, which discloses exemplary embodiments of SOB technology.

In a typical manufacturing process, a patterned $SiO_2$ layer is provided on a major surface (typically 100-oriented) of a Si body, with a patterned metal layer on the $SiO_2$, and exposed regions of Si are anisotropically etched by means of contact with an amine-containing anisotropic etchant for Si. Frequently, the metal layer comprises Ti, typically a Ti layer disposed directly on the $SiO_2$. Furthermore, the metal layer frequently comprises one or more other metals disposed on the Ti layer. Exemplary of these other metals are the platinum metals.

It is at least very desirable that the step of anisotropically etching Si does not produce any significant changes in the metal layer, since such changes are likely to have a negative impact on device performance and/or reliability.

SUMMARY OF THE INVENTION

We have found that etching Si in an amine-based anisotropic etchant such as EDP (ethylenediamine pyrocatechol) frequently results in undesirable changes in the, simultaneously contacted, Ti-comprising metal layer. We have also found how to decrease or avoid the changes. The novel method involves electrolysis.

More particularly, the invention is embodied in a method of manufacturing an article that comprises, at least at some stage of its manufacture, a Si body that has a major surface, with a patterned dielectric (exemplarily $SiO_2$) layer on the surface, and with a patterned Ti-comprising metal layer on the dielectric layer. The dielectric layer and metal layers are patterned such that a portion of the Si surface is exposed. The embodiment comprises contacting at least the exposed portion of the Si surface and at least a portion of the patterned metal layer with an amine-based anisotropic etchant for silicon, such that the exposed portion of the silicon surface is etched. Significantly, the embodiment also comprises providing an auxiliary electrode, contacting the electrode with said anisotropic etchant, and applying a voltage between said auxiliary electrode and said metal layer. The voltage is applied during at least part of the time the exposed portion of the silicon surface is contacted with the etchant, and such that the electrode is the cathode of the thus formed electrolytic cell. After completion of the anisotropic etch, one or more conventional process steps (e.g., further metal or dielectric etching, photolithography, metal and/or dielectric deposition, solder attachment of components, wire bonding, dicing, lapping, and encapsulation) are carried out towards completion of the article.

DETAILED DESCRIPTION

The discussion below will be primarily in terms applicable to SOB technology. This is for the sake of clarity only and does not imply any limitation on the scope of the invention.

In SOB technology it is conventional to provide a Si body having a (100)-oriented oxidized major surface, with patterned metallization thereon. Exemplarily, the metallized areas are provided for subsequent attachment of, e.g., semiconductor lasers, photodetectors, temperature sensors, light emitting diodes, electronic components and metallized fiber. The metallization typically comprises a Ti layer on the silicon oxide (conventionally referred to as $SiO_2$), with other metal layers (e.g., Pt) typically on the Ti layer. The invention is not limited to a Ti/Pt metallization layer but applies also to a Ti layer, and to a variety of other metals (e.g., the remaining platinum metals Ru, Rh, Pd, Os, and Ir; the transition metals Fe, Co, Cr and Ni; Au, Ag, and W, possibly conducting silicides and nitrides) on a Ti "glue" layer. Furthermore, the dielectric layer need not be $SiO_2$ but could be silicon nitride, ceramic, or any other appropriate non-conductive material.

It is also conventional to open windows in the dielectric layer, thereby exposing the underlying Si, and to anisotropically etch the exposed Si (e.g., to form V-grooves for subsequent attachment of optical fibers, or to form pyramid-shaped indentations for alignment purposes). At a subsequent stage in the processing sequence, the metal that overlies the Ti layer may be removed, e.g., by etching in aqua regia, although this is not typically the case.

Figure 1:
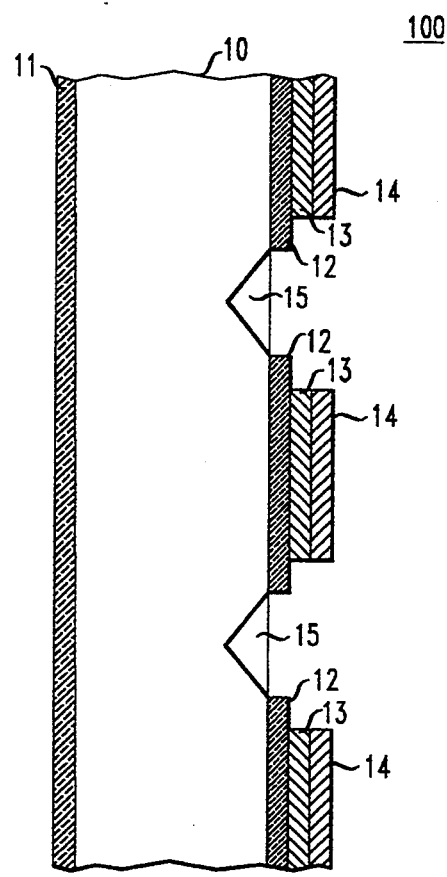
FIG. 1 shows, in schematic cross section, a portion of an exemplary article which can be produced by a process according to the invention.

FIG. 1 schematically depicts a portion of an exemplary body 100 that can be produced by a process according to the invention. Numeral 10 refers to a Si wafer, 11 and 12 to $SiO_2$ layers, 13 to a Ti layer, 14 to a Pt layer, and 15 to pyramid-shaped indentations produced by anisotropic etching.

The anisotropic Si etchant typically is amine-based. Exemplary of such etchants is PSE-300, available from Transene Co., Inc. of Rowley, Mass., which consists of 68% (V/V) ethylenediamine, 12% (W/V) pyrocatechol, balance water. See also R. M. Finne et at., *Journal of the Electrochemical Society*, Vol. 114(9), pp. 965–970; and H. Linde et al., *Journal of the Electrochemical Society*, Vol. 139(4), pp. 1170–1174, both incorporated herein by reference, which disclose other amine-based anisotropic etchants for Si. We will herein apply the designation "EDP" collectively to the class of amine-based anisotropic etchants for Si that are relevant to the instant invention.

We have noticed that etching of exposed Si areas on a Si body that also comprises Ti-containing metallization can result in changes in the metallization that are observable by visual inspection. The changes not only constitute a cosmetic problem but are believed to also pose, at least in some cases, a reliability problem. We have also noticed that immersion into the same etchant of a similar body that is free of exposed Si does not result in observable change in the metallization.

We currently believe that the observed changes are related to a volume expansion of (all or portions) of the Ti layer. Preliminary analysis suggests that the volume expansion is attributable to the formation of a Ti-containing compound or compounds (typically $TiO_2$). The compound formation typically occurs to a much greater extent than in the formation of the (customary) thin passive layer on Ti in EDP. The thus formed compound is attacked by aqua regia.

The above discussion is offered for tutorial purposes only, and the scope of the claimed invention does not depend on the correctness of the suggested mechanism.

Figure 2:
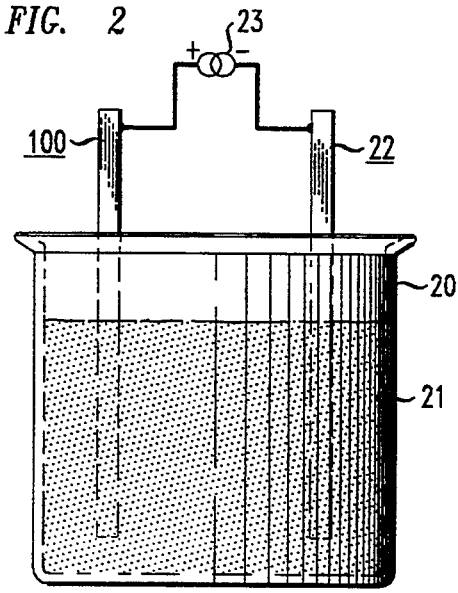
FIG. 2 schematically depicts a step in the manufacturing process according to the invention, the step comprising anisotropic etching of exposed silicon area.

We found that the effect is pronounced in Ti regions at the base of pores in the thin Pt overlayer, leading to a blistering effect. The solution of the above described problem involves making the body that is to be etched the anode in an electrolytic cell, as is schematically depicted in FIG. 2. Numeral 20 refers to an appropriate vessel, e.g., a laboratory beaker, 21 to the etchant, e.g., PSE-300 at 100° C., 100 to the body to be etched, 22 to an appropriate auxiliary electrode, e.g., a Pt foil, and 23 to any appropriate supply of electrical power, e.g., a constant current source. Means are provided for connecting the output terminals of power supply 23 to electrode 22 and the metallization layer of body 100. Such means are conventional and may comprise, for instance, Au-plated clips. It will be appreciated that all the metallized regions of 100 should be connected to the positive terminal of 23. In practice this will typically be accomplished by patterning the metallization layer such that all portions thereof are electrically connected, followed by an etching step (subsequent to the anisotropic Si etch) that removes undesired electrical connections.

Figure 3:
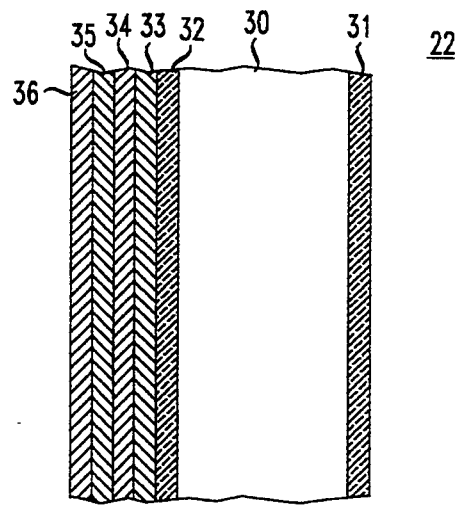
FIG. 3 shows in schematic cross section, a portion of an exemplary body that can be used as auxiliary electrode in the electrolytic cell of FIG. 2.

FIG. 3 schematically shows a portion of an auxiliary electrode wherein 30 refers to a Si wafer, 31 and 32 to $SiO_2$ layers, 33 to a Ti layer, 34 and 36 to Pt layers, and 35 to a Au layer. Such an electrode can be made by conventional means.

Those skilled in the art will appreciate that the electrode of FIG. 3 is exemplary only, and that an electrode can take any appropriate form (e.g., foil, coil or wire) and consist of any conducting material which is inert with respect to the etchant. Exemplary of such materials are Pt, Ru, Rh, Pal, Au and graphite.

By measurement of cell voltages we determined that, under conventional etching conditions (100° C. EDP) the Si potential is negative with respect to Ti and Ti/Pt by about 0.55 V and 0.75 V respectively, indicating that the presence of Si in the etchant drives the Ti into a cathodic reaction. This can be prevented by electrolytic means, namely, by making the body that is to be etched the anode in an electrolytic cell, and by flowing a current of operative magnitude through the cell. The magnitude of the current depends typically on a variety of factors, including total exposed metallization and Si area, and thus cannot be specified in advance. However, a minor amount of experimentation will generally suffice to determine an appropriate value of current and/or voltage. Exemplarily, the current density is in the range 0.02–1 $mA/cm^2$, exemplarily 0.1–0.2 $mA/cm^2$, with the relevant area being the metallization area.

EXAMPLE

A 4-inch Si wafer with a 1 μm layer of $SiO_2$ on both sides was metallized on one side by sputter deposition of 100 nm Ti, followed by 200 nm Pt. The metallization was conventionally patterned and etched to form openings to the underlying $SiO_2$ while maintaining electrical continuity of the metallization. The $SiO_2$ layer was then patterned and etched, exposing approximately 400 regularly spaced, 530 μm square, regions of Si. The metallization was patterned to provide at least 200 μm set-back from the windows to Si, ensuring the absence of electrical leakage from the metallization to the Si.

An auxiliary electrode was prepared by a similar process, except that on one $SiO_2$ layer was sputter deposited Ti/Pt/Au/Pt with thicknesses 100 nm, 200 nm, 500 nm and 200 nm, respectively, and except that the metallization and $SiO_2$ were not patterned.

Commercially obtained EDP (PSE-300) in a covered PYREX ® vessel was heated to 100° C. with a nitrogen bubbler and reflux apparatus. A constant current power supply (Hewlett-Packard 6216A) was connected between the above described two wafers, with the patterned wafer connected to the positive output terminal and the other wafer to the negative output terminal. Au-plated electroplating clips and Pt wires in Teflon ® sleeves were used to make the electrical connections. After placing the two wafers into the hot etchant, a DC current of 10 mA was flowed through the cell. The applied voltage was about 1 V. The wafers remained in the cell for 5 hours, resulting in formation of pyramid-shaped indentations at the exposed Si regions. The observed rate of corrosion was about 10% of the rate observed on an identical patterned wafer that was etched in the same etchant, but without electrolytic protection.

We claim:

1. A method of manufacturing an article that comprises, at least at some stage of its manufacture, a silicon body having a major surface, the method comprising
    a) providing a patterned dielectric layer on said major surface and a patterned Ti-comprising metal layer on the dielectric layer, the dielectric layer and the metal layer patterned such that a portion of the silicon surface is exposed;
    b) providing an auxiliary electrode;
    c) contacting the exposed portion of the silicon surface, the auxiliary electrode and at least a portion of the patterned metal layer with an amine-based anisotropic etchant for silicon; and
    d) flowing a current between said auxiliary electrode and said metal layer, with said metal layer being the anode, said current being flowed during at least part of the time the exposed portion of the silicon surface is contacted with said anisotropic etchant.

2. Method of claim 1, wherein said anisotropic etchant comprises ethylenediamine pyrocatechol.

3. Method of claim 1, wherein said dielectric is $SiO_2$.

4. Method of claim 1, wherein said Ti-comprising metal layer is a Ti layer.

5. Method of claim 1, wherein said Ti-comprising metal layer comprises a Ti layer and a further layer on the Ti layer, the material of the further layer selected from the group consisting of Pt, Ru, Rh, Pd, Os, Ir, Fe, Co, Cr, Ni, Au, Ag, W, the conducting silicides and the conducting nitrides.

6. Method of claim 5, wherein the dielectric is $SiO_2$, the material of said further layer is Pt, and the anisotropic etchant comprises ethylenediamine pyrocatechol.

7. Method of claim 1, wherein said auxiliary eletrode comprises a material selected from the group consisting of Pt, Ru, Rh, Pd, Au and graphite.

8. Method of claim 1, wherein said current is selected to result in a current density in the range 0.02-1 mA/cm$^2$, the relevant area being the metal layer area that is contacted with the etchant.

9. Method of claim 1, further comprising mounting one or more of a laser, light emitting diode, temperature sensor, photodetector, electronic component and metallized fiber on said patterned metal layer.

* * * * *